(12) United States Patent
Katagiri et al.

(10) Patent No.: US 7,504,734 B2
(45) Date of Patent: Mar. 17, 2009

(54) SEMICONDUCTOR DEVICE HAVING IMPROVED SOLDER JOINT AND INTERNAL LEAD LIFETIMES

(75) Inventors: Mitsuaki Katagiri, Chuo-ku (JP); Hisashi Tanie, Tsuchiura (JP)

(73) Assignee: Elpida Memory, Inc., Tokyo (JP)

( * ) Notice: Subject to any disclaimer, the term of this patent is extended or adjusted under 35 U.S.C. 154(b) by 387 days.

(21) Appl. No.: 11/063,877

(22) Filed: Feb. 24, 2005

(65) Prior Publication Data
US 2005/0236697 A1 Oct. 27, 2005

(30) Foreign Application Priority Data
Feb. 27, 2004 (JP) ............................. 2004-052613

(51) Int. Cl.
H01L 23/48 (2006.01)
H01L 23/52 (2006.01)
H01L 29/40 (2006.01)

(52) U.S. Cl. ...................................... 257/784; 257/778
(58) Field of Classification Search .................. 257/778, 257/784, 734
See application file for complete search history.

(56) References Cited

U.S. PATENT DOCUMENTS 5,789,809 A * 8/1998 Joshi ........................... 257/704
6,114,753 A * 9/2000 Nagai et al. ................... 257/668

FOREIGN PATENT DOCUMENTS

JP 11-312772 A 11/1999
JP 2001-332645 A 11/2001

OTHER PUBLICATIONS

Charles A. Harper, Electronic Packaging and Interconnection Handbook, 2000, McGraw-Hill, pp. 1.7 and 1.8.*

* cited by examiner

Primary Examiner—Monica Lewis
(74) Attorney, Agent, or Firm—Sughrue Mion, PLLC

(57) ABSTRACT

A semiconductor chip is mounted on a flexible wiring board through the interposition of an elastmer. The flexible wiring board is made up of a tape on which wiring is fixed. A part of the wiring is projected beyond the edge of the tape, extended in the direction of the thickness of the elastmer and connected to an electrode of the semiconductor chip. The edge of the tape beyond which the wiring is projected protrudes beyond the edge of the elastmer by a length no smaller than the thickness of the elastmer.

6 Claims, 9 Drawing Sheets

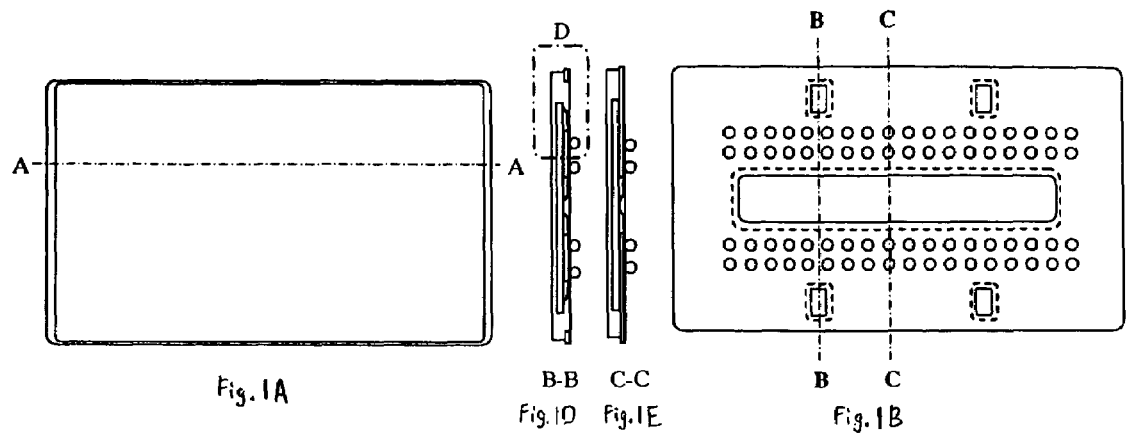
Fig. 1A  B-B Fig. 1D  C-C Fig. 1E  Fig. 1B
A-A Fig. 1C
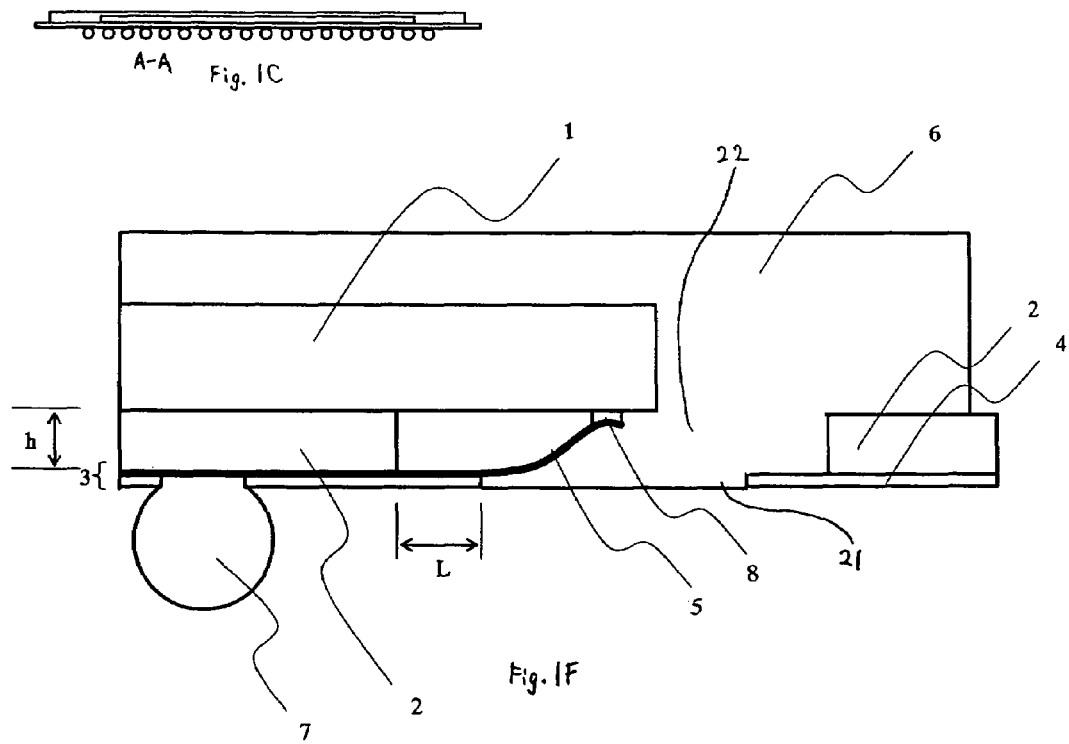
Fig. 1F

Fig. 3A

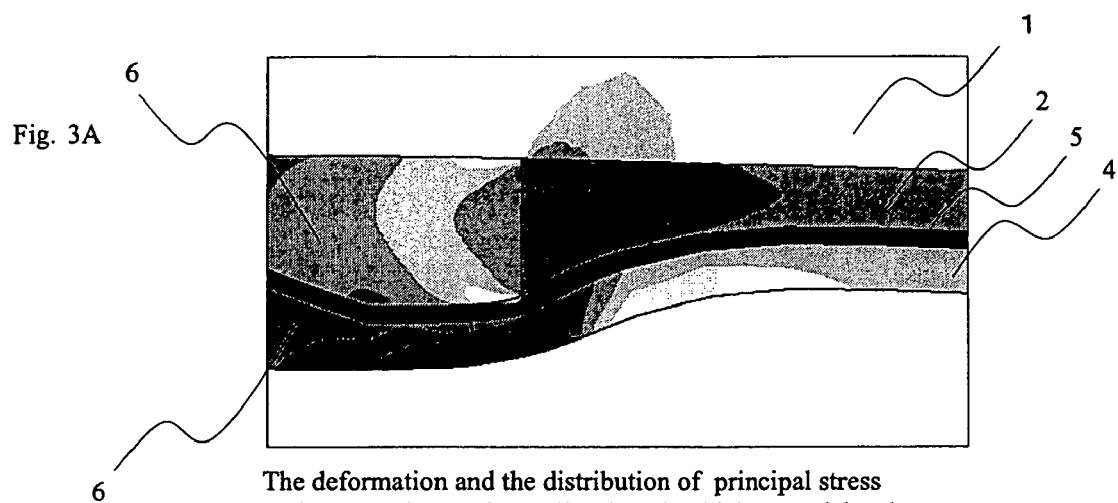

The deformation and the distribution of principal stress in the case where L is smaller than the thickness of the elastmer

Fig. 3B

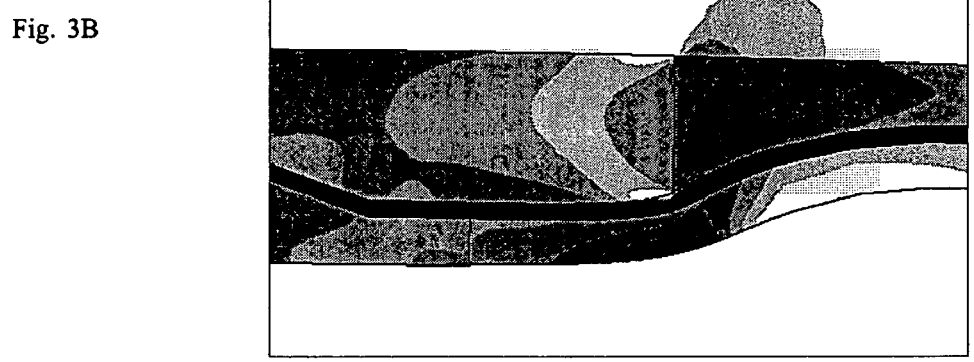

The deformation and the distribution of principal stress in the case where L is larger than the thickness of the elastmer

Fig. 3C

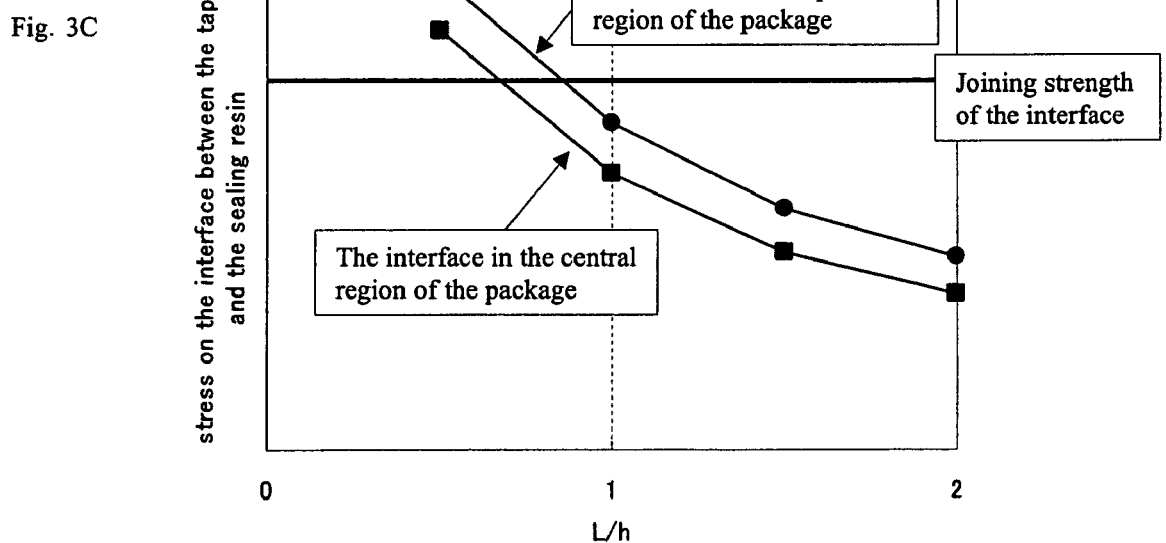

Relationship between the distance between the edge of the tape and the edge of the elastmer, and stress on the interface E-E Cross Section

SEMICONDUCTOR DEVICE HAVING IMPROVED SOLDER JOINT AND INTERNAL LEAD LIFETIMES

BACKGROUND OF THE INVENTION

1. Field of the Invention

The present invention relates to a semiconductor device, particularly to the packaging technology of the semiconductor device.

2. Description of the Related Art

Semiconductor packages (semiconductor devices) have been employed in a variety of information technology devices such as large-scale computers, personal computers, portable devices, etc. Accompanying the high functionality of these devices, the quantity of elements such as semiconductor parts and wiring leads etc. to be installed in the device has increased annually. This has entailed an increase in the mounting area of the semiconductor package which inhibits decreasing the size of the devices. For this reason, chip size package (CSP) technology has been developed in which a semiconductor package is constructed in the same size as a semiconductor chip and multiple semiconductor chips are mounted on a mounting board.

Regarding this chip-sized semiconductor package, a variety of techniques has been proposed to improve the reliability of internal lead wires. For example, JP Hei 11-312772 describes a structure in which the lead wire is protected by bending the wire in a half-wave form. Further, JP 2001-332645 describes a structure for protecting a lead wire through the use of a dummy lead.

In a semiconductor package, in addition, an occasion can occur in which heat generation brought about by variation of the ambient temperature and/or operation of the device causes heat load on the semiconductor package. The amount of thermal expansion between the semiconductor package and mounting board can differ and if the heat load is applied, then a case can occur in which the heat load causes stress on the solder joint between the semiconductor package and mounting board. In this case, a low-elasticity member, for example, an elastmer etc., is arranged as a stress buffer member within the semiconductor package, and when the heat load is applied, deformation of the stress buffer member acts to absorb the difference of the amounts of the thermal distortion between the semiconductor package and mounting board. In this way, the reliability of the solder joint between the semiconductor package and mounting board can be improved. In this arrangement, however, if deformation of the stress buffer member increases, stress affects the lead wire within the package, which causes concern that a break in the lead wire may occur.

SUMMARY OF THE INVENTION

It is an object of the present invention to provide at low cost a semiconductor package adapted to improve the lifetimes of both the solder joint between the semiconductor package and mounting board and the leads (wirings) within the package against the effect of heat load.

In order to attain the object, the semiconductor device of the present invention is provided with a semiconductor chip having an electrode formed on the major surface. An elastic structural member is fixed to the major surface of the semiconductor chip so as to expose the electrode. A base member is fixed to a second surface of the elastic structural member, wherein the second surface is a surface on the side opposite to the first surface to which the semiconductor chip is fixed. Wiring is fixed to the base member and the wiring is projected beyond the edge of the base member. The wiring that is projected from (beyond) the edge of the base member is extended in the direction of the thickness of the elastic structural member and connected to the electrode of the semiconductor chip. The edge of the base member, beyond which the wiring is projected, protrudes beyond the edge of the elastic structural member by a length no smaller than the thickness of the elastic structural member.

In this structure, an elastic structural member is arranged between the base member, to which the wiring connected to the mounting board is fixed, and the semiconductor chip. Thus, it allows for the stress imposed on the joint portion between the semiconductor device and mounting board due to heat load etc. to be relaxed, thereby improving the lifetime of the joint portion. In addition, the structure in which a part of wiring, which is projected beyond the edge of the base member and thus extends alone, is arranged in a portion that is away from the edge of elastic structural member, relaxes the stress on the part of wiring that extends alone caused by the heat load and the stress, thereby improving the lifetime of the wire. As described above, the present invention offers advantages of simultaneously improving the lifetime of the joint portion between a semiconductor device and a mounting board and the lifetime of the wiring within a semiconductor device, thereby providing a semiconductor device of high reliability.

The above and other objects, features and advantages of the present invention will become apparent from the following description with reference to the accompanying drawings which illustrate examples of the present invention.

BRIEF DESCRIPTION OF THE DRAWINGS

FIGS. 1A and 1B are the top and bottom views of the semiconductor package of the first embodiment according to the present invention;

FIG. 1C is a cross-sectional view along the A-A line of FIG. 1A;

FIG. 1D is a cross-sectional view along the B-B line of FIG. 1B;

FIG. 1E is a cross-sectional view along the C-C line of FIG. 1B;

FIG. 1F is a partially enlarged cross-sectional view of section D of FIG. 1D;

FIG. 3A is a diagram representing the local deformation and distribution of principal stress when heat load is applied in a semiconductor package compared to the semiconductor package shown in FIG. 1A.

FIG. 3B is a diagram representing the local deformation and distribution of principal stress when heat load is applied in a semiconductor package shown in FIG. 1A.

FIG. 3C is a graph representing the variation of the stress in the interface between the tape and sealing resin in the region near the edge of the tape beyond which the wiring lead projects, plotted against the variation of the amount of protrusion of the edge of the tape, beyond which the wiring lead projects, with respect to the edge of the elastmer;

DETAILED DESCRIPTION OF THE PREFERRED EMBODIMENTS

First Embodiment

Figure 2:
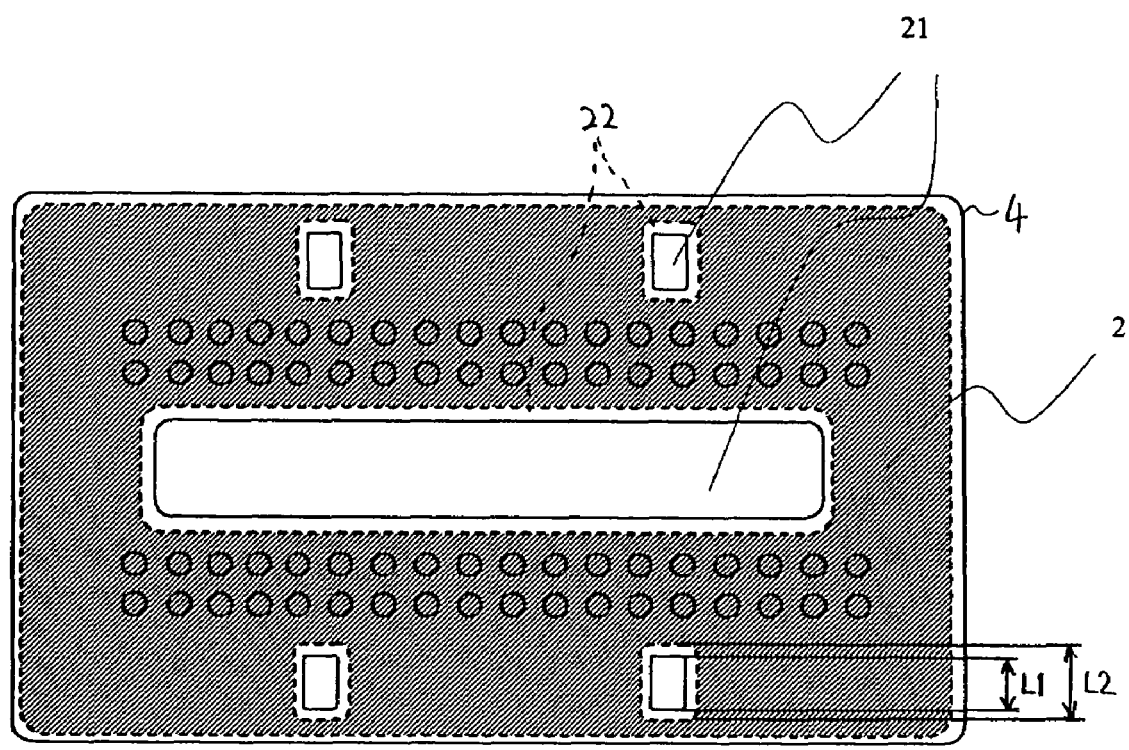
FIG. 2 is a bottom view of the semiconductor package shown in FIG. 1A as viewed through the elastmer.

FIGS. 1A to 1F and FIG. 2 represent a semiconductor package of a first embodiment according to the present invention.

The semiconductor package of the present embodiment has a structure in which semiconductor chip 1 is arranged on flexible wiring board 3 through the interposition of elastmer (elastic structure member) 2 with the periphery of semiconductor chip 1 sealed by means of sealing resin 6. Flexible wiring board 3 comprises flexible tape 4, which serves as a base member of the wiring board, and wiring lead 5 arranged in a prescribed pattern on the surface of flexible tape 4. Tape 4 is made of, for example, polyimid and is about 50 µm thick, and wiring lead 5 is made of, for example, Cu (copper) and is about 20 µm thick. Elastmer 2 adheres to the surface of flexible wiring board 3 having wiring lead 5 arranged thereon and is about 150 µm thick, for example. The overall size of the semiconductor package is about 17 mm long in the longitudinal direction, for example.

Semiconductor chip 1 has electrode 8 formed in a predetermined pattern on one surface (major surface) and adheres to elastmer 2 so that the surface on which electrode 8 is formed faces elastmer 2. Electrodes 8 are formed into bumps (protruded electrodes) in the present embodiment and are positioned in the outer peripheral region, where four electrodes are arranged, and in the central region which extends in the longitudinal direction.

As are shown in FIGS. 1B, 1F and 2, flexible wiring board 3 and elastmer 2 have openings 21 and 22, respectively, formed in the positions corresponding to electrodes 8 of semiconductor chip 1. Opening 22 of elastmer 2 is larger than opening 21 of flexible wiring board 3 and, as is shown in FIG. 1F, the edge of opening 21 of flexible wiring board 3 protrudes by the amount shown in length L from the edge of opening 22 of elastmer 2. As described later, L is no smaller than the thickness h of elastmer 2.

A part of wiring lead 5 extends beyond (i.e., protrudes from) the edge of opening 21 of flexible wiring board 3 on the semiconductor chip 1 side. This part of wiring lead 5 extends through opening 22 of elastmer 2 to electrodes 8 of semiconductor chip 1, where wiring lead 5 is connected to electrodes 8. The part of wiring lead 5 that extends alone is curved and extended in a circular arc form.

Flexible wiring board 3 has solder balls 7 formed in a prescribed pattern, which are connected to wiring lead 5 via the openings of tape 4. The semiconductor package is mounted on the mounting board of the device employing these solder balls 7 as terminals for connecting to an external circuit. Consequently, the portions of wiring lead 5 are exposed through the openings of tape 4 and serve as land regions.

In this regard, between semiconductor chip 1 and the mounting board there is a difference in the linear thermal expansion coefficient. This difference gives rise to a difference in the amounts of thermal deformation of semiconductor chip 1 and the mounting board when the heat load is imposed on a semiconductor package that comes from heat generation during operation of semiconductor chip 1 and/or an ambient temperature change. In the present embodiment, because elastmer 2 is interposed between solder ball 7 and semiconductor chip 1, deformation of elastmer 2 is able to accommodate the difference in the amounts of thermal deformation of semiconductor chip 1 and the mounting board when the heat load is imposed. Consequently it becomes feasible according to the present invention to suppress the stress, that may possibly be created in solder ball 7 to a small value as compared to the case in which only the shearing deformation of solder ball 7, which is the joint between semiconductor chip 1 and the mounting board, accommodates the difference in the amounts of thermal deformation of semiconductor chip 1 and the mounting board. In this way, it becomes feasible to improve the lifetime of the solder joint.

The difference in the amounts of thermal deformation of semiconductor chip 1 and the mounting board increases in proportion to the size of semiconductor chip 1. Accordingly, the present embodiment can improve the lifetime of the solder joint more effectively in a semiconductor package having larger-scale semiconductor chip 1.

In order to effectively accommodate the difference in the amounts of thermal deformation of semiconductor chip 1 and the mounting board through the use of an elastmer as described above when the heat load is imposed, a easily-deformable low-elastic material is suitable as a material for elastmer 2. In the present embodiment, the resin is employed as elastmer 2 material that has an elastic constant one or more orders of magnitude smaller than the solder material.

In this regard, elastmer 2 has a higher linear thermal expansion coefficient than tape 4, wiring lead 5 and sealing resin 6. As a result, when heat load is imposed on the semiconductor package, the amount of the thermal deformation of elastmer 2 attains a larger value than the amounts of thermal deformation of the members adjoining elastmer 2

FIGS. 3A and 3B represent the deformation and the distribution of principal stress near the end portion of elastmer 2 when the temperature has fallen, wherein the deformation and the distribution of principal stress are calculated using the finite element method: FIG. 3A represents the case in which protrusion length L is smaller than the thickness h of elastmer 2 (an example for comparison with the present invention), wherein length L refers to the length by which the edge of opening 21 of flexible wiring board 3 protrudes from the edge of opening 22 of elastmer 2; and FIG. 3B represents the case that L is longer than h (corresponds to the present embodiment). In these figures, the deformation is expressed in a magnified representation. The stress distribution is represented by thickness, showing that the thicker the thickness, the higher is the value of stress.

A drop in the temperature of elastmer 2 causes elastmer 2 to exhibit a large contraction. Semiconductor chip 1, which is disposed on the top of elastmer 2, exhibits no great deformation because of its high rigidity. In contrast to this, flexible wiring board 3, which is disposed under elastmer 2, displaces to approach semiconductor chip 1 following the deformation of elastmer 2. Consequently, flexible wiring board 3 deforms in such a way that it becomes bent convexly downward in the vicinity of the edge of opening 21 of elastmer 2 on the semiconductor chip 1 side.

This bending deformation causes creating a tensile stress on the interface between flexible wiring board 3 and sealing resin 6. Flexible wiring board 3 and sealing resin 6 are exfoliated from each other when the tensile stress grows to surpass the bonding strength between flexible wiring board 3 and sealing resin 6 on the interface between them. The exfoliation of flexible wiring board 3 and sealing resin 6 tends to start from the vicinity of elastmer 2, because the stress that acts on the interface between flexible wiring board 3 and sealing resin 6 becomes stronger in the position nearer elastmer 2. When the above exfoliation develops to reach the part of wiring lead 5 that extends alone from the edge of tape 4, a stress is applied to the part of wiring lead 5 that is not supported by tape 4, resulting in an enhanced risk of breaking wiring lead 5.

In the position of the edge of opening 21 of flexible wiring board 3, where wiring lead 5 starts extending alone, the stress exerted on the interface between flexible wiring board 3 and sealing resin 6 decreases as the distance L between the edges of flexible wiring board 3 and elastmer 2 increases, as is seen from FIGS. 3A and 3B. FIG. 3C represents the variation of this stress plotted against L when the heat load, assuming an ordinary condition of operation, is applied while mounting the semiconductor package on a mounting board.

In this case, this stress depends on thickness of elastmer 2 also. In detailed terms, the amount of thermal distortion in the direction of thickness of elastmer 2 is expressed as a product of the linear thermal expansion coefficient, thickness and temperature variation of elastmer 2; and accordingly, the thicker elastmer 2 is, the larger is the amount of deformation of elastmer 2 caused by the heat load, resulting in larger stress. For this reason, the stress is approximately proportional to the ratio of L to the thickness h of elastmer 2. Thus, the variation of the stress is represented by employing L/h as an abscissa in FIG. 3C.

Further, this stress is larger in the peripheral region of the semiconductor package, i.e., the region corresponding to electrodes 8 arranged in the peripheral region of semiconductor chip 1, than in the central region of the semiconductor package, i.e., the region corresponding to electrodes 8 arranged in the central region of semiconductor chip 1. This is because the positional deviation caused by the difference in the amounts of thermal distortion of the semiconductor package and mounting board increases with progression away from the central region of the semiconductor package. For this reason, FIG. 3C represents the variations of the stress in the central and peripheral regions by separate curves.

As is seen from FIG. 3, it is feasible to constrain the stress in the edge of flexible wiring board 3 to the value smaller than the joining strength on the interface between flexible wiring board 3 and sealing resin 6 in the case where L/h is no less than 1, i.e., L is no smaller than h. It follows that the present embodiment, in which L is set to the value no smaller than h, makes it possible to suppress an occurrence of exfoliation of sealing resin 6 in the region where wiring lead 5 extends alone toward electrode 8 of semiconductor chip 1, thereby enabling suppression of breaking of wiring lead 5 and leading to the improvement in the lifetime of wiring lead 5. In this regard, L can be set to be comparatively small in the central region of the semiconductor package, because the stress exerted on wiring lead 5 at an edge portion is smaller in the central region of the semiconductor package than in the peripheral region of the semiconductor package, as described above. This means that even a comparatively small L enables obviating a break of wiring lead 5.

In addition, on account of the differences of the amounts of thermal distortion of respective constituent members, the distance between electrode 8 of semiconductor chip 1 and the edge of flexible wiring board 3, beyond which wiring lead 5 is projected, changes when the heat load is imposed. In the present embodiment, it is feasible to accommodate the change of the above distance by the deformation of wiring lead 5, because the part of wiring lead 5 that extends alone extends in a circular arc form, which provides room for the length. This arrangement also enables the stress imposed on wiring lead 5 to be reduced, thereby improving the lifetime.

As described above, the construction of the semiconductor package of the present embodiment enables simultaneously improving both the lifetime of the junction of solder ball 7 and the lifetime of wiring lead 5, thereby providing a highly reliable semiconductor package.

Explanation next regards the method of fabricating a semiconductor package of the present embodiment referring to FIGS. 4A to 4G.

Figure 4A:
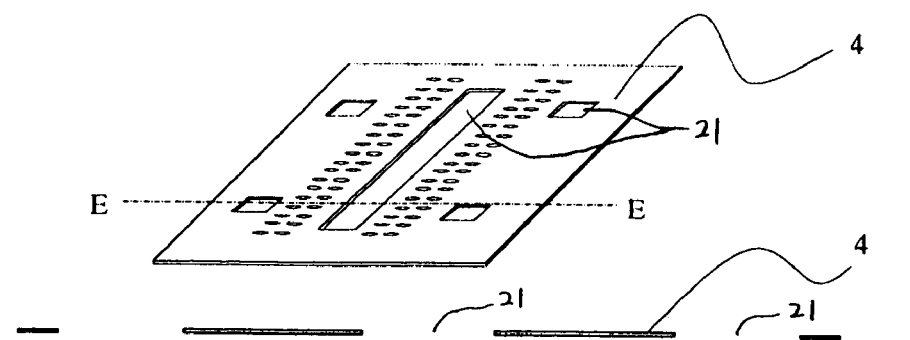
FIGS. 4A to 4G are diagrams illustrating the fabrication process of the semiconductor package shown in FIG. 1A.
Figure 4B:
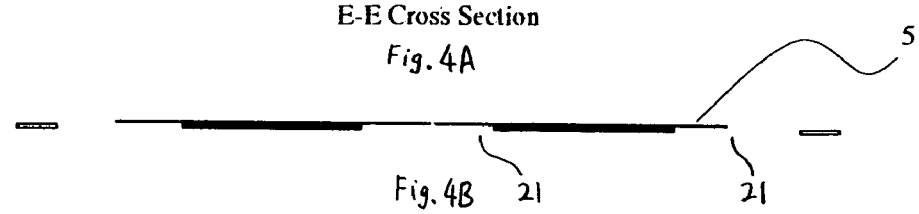

First, tape 4 is prepared, which has openings 21 and the openings corresponding to solder balls 7, as shown in FIG. 4A and wiring leads 5 adhere tape 4, as shown in FIG. 4B, wherein each wiring lead 5 is arranged such that a part of each wiring lead 5 is projected from tape 4 in each opening 21.

Figure 4C:
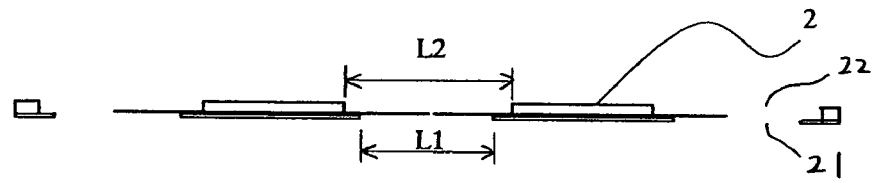

Next, elastmer 2 is arranged on the surface of tape 4 on the side on which wiring leads 5 adhere as shown in FIG. 4C. In this occasion, elastmer 2 is arranged such that the centers of openings 21 of tape 4 and openings 22 of elastmer 2 may respectively coincide.

In this step, it is necessary to set the size L2 of opening 22 of elastmer 2 such that the size L2 will be at least 2h (double h) longer than the size L1 of opening 21 of tape 4, in order to set distance L between the edges of tape 4 and elastmer 2 to be larger than the thickness h of elastmer 2 as measured with reference to the edge of each opening 21 of tape 4 beyond which wiring lead 5 is projected. Further, allowing for the fluctuations (±e) due to size errors and/or assembling errors of tape 4 and elastmer 2, it is necessary to set size L2 of opening 22 of elastmer 2 to be $L2 \geq L1 + 2h + e.$ It is common to limit the fluctuations e to the value smaller than thickness h of elastmer 2. Thus, setting L2 to be $L2 \geq L1 + 3h$ can meet the above condition while allowing room for e.

Figure 4D:
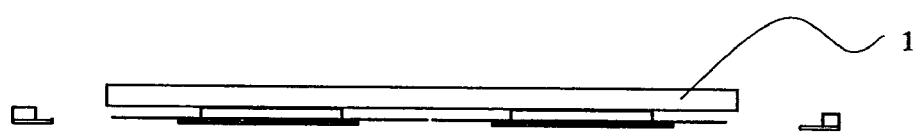
Figure 4E:
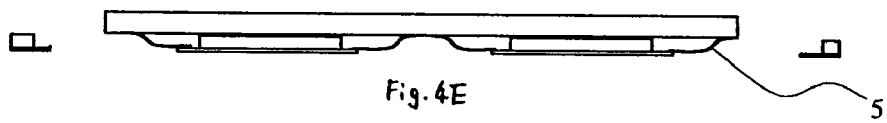

In the next step, semiconductor chip 1 is laid out on elastmer 2, as shown in FIG. 4D. Subsequently, the tips of wiring leads 5 projected from tape 4 are bonded to electrodes 8 by means of an appropriate bonding technique, as shown in FIG. 4E. In this step, setting the projected length of wiring lead 5 to a length prescribed to have room relative to the distance between the edge of opening 21 and electrode 8 of semiconductor chip 1 makes it possible to extend wiring lead 5 in a circular-arc-like curved form.

Figure 4F:
Figure 4G:
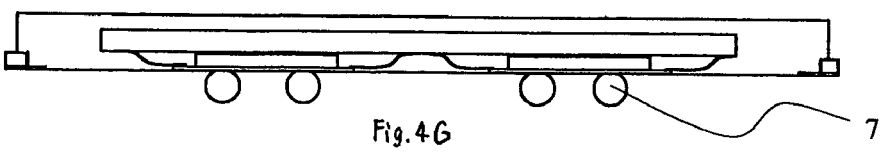

In the next step, sealing is effected through the use of sealing resin 6 such that only the surface of tape 4, on the side on which no wiring leads 5 adhere, is exposed as shown in FIG. 4F. Finally, solder balls 7 are joined to wiring leads 5 exposed through the openings of tape 4.

As described above, the present embodiment does not necessitate adding new constituent members or procedures to ensure the reliability of wiring lead 5. As a result, it has the capability to provide a semiconductor package having improved reliability at a low cost. Because, however, distance L between the edges of tape 4 and elastmer 2 is set to a comparatively large value, it is necessary, in the step of injecting sealing resin 6 and hardening it, to prescribe the material and injection conditions of sealing resin 6 appropriately to prevent voids or the like from being created near the edge of elastmer 2.

For reference, although the present embodiment is configured such that the edge of opening 21 of tape 4 protrudes relative to the edge of opening 22 of elastmer 2 by a length no smaller than thickness h of elastmer 2 in each of all four sides of the rectangular shape, it is also permissible to configure a semiconductor device according to the present invention such that the protrusion length h is ensured relative to only the side beyond which wiring lead 5 is projected. Even if this configuration is applied, the technical advantage of improving the lifetime of wiring lead 5 is not lost.

In addition, while the above fabrication process is described as an example of a variety of fabrication processes that can be used to fabricate a semiconductor package according to the present invention, it is a matter of course that, if a semiconductor module has a structure as featured in the present invention, the technical effects of the present invention can be obtained, even if the semiconductor module has been fabricated through any of the other fabrication processes.

Second Embodiment

Figure 5:
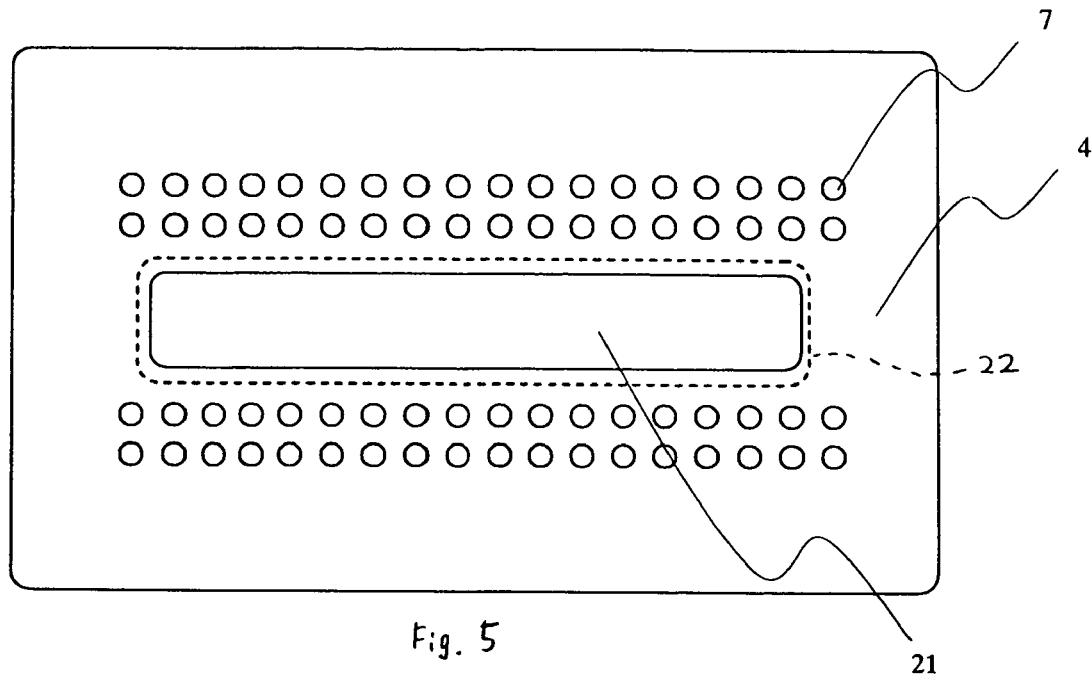
FIG. 5 is a bottom view of the semiconductor package of the second embodiment according to the present invention.

FIG. 5 is a bottom view of the semiconductor package of a second embodiment according to the present invention. A point of difference from the first embodiment is that opening 21 of tape 4 is not in the peripheral region of the package, but only in the central region of the package. The configuration of the present embodiment can be appropriately applied in the case where a semiconductor chip that is to be mounted on a semiconductor package has an electrode only in the central region.

In the present embodiment as also in the first embodiment, a semiconductor chip is mounted through the interposition of an elastmer on a flexible wiring board, i.e., tape 4. Therefore, detailed explanation is omitted. This configuration allows reducing the stress imposed on the portion that is joined between the semiconductor chip and mounting board, which comes from the heat load, thereby improving the lifetime of the portion that is joined. Further, by setting the size L2 of opening 22 of elastmer to be $$L2 \geq L1 + 3h$$

for the size L1 of opening 22 of tape 4 and the thickness h of the elastmer, it becomes feasible to suppress exfoliation of the sealing resin in the part in which the wiring lead extends alone between the flexible wiring board and an electrode of the semiconductor chip, thereby improving the lifetime of a wiring lead in a semiconductor package. In this regard, because the stress exerted on the interface between tape 4 and sealing resin 6 is smaller in the central region of the package than it is in the peripheral region of the package as shown in FIG. 3, this allows effective improvement of the endurance of the lead wire in the present embodiment, thereby providing a semiconductor package of higher reliability.

Third Embodiment

Figure 6:
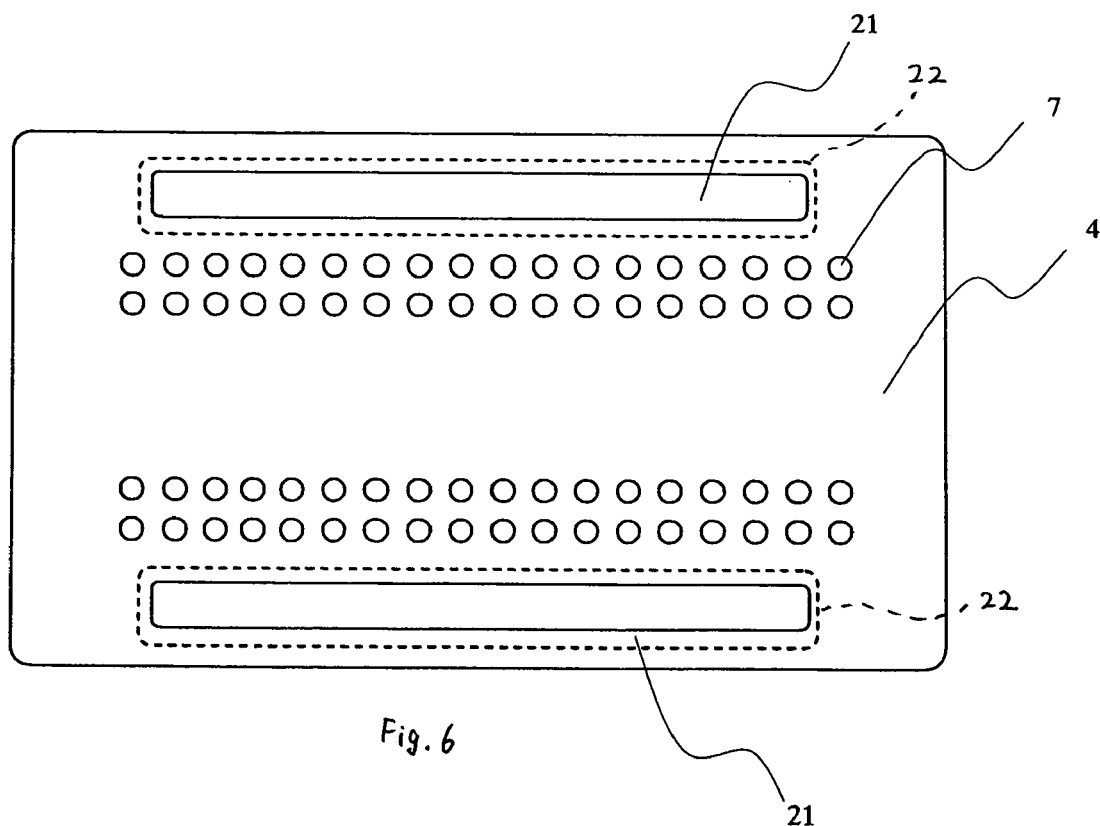
FIG. 6 is a bottom view of the semiconductor package of the third embodiment according to the present invention.

FIG. 6 is a bottom view of a semiconductor package of a third embodiment according to the present invention. A difference from the first and second embodiments is that the opening 21 of tape 4 is not located in the central region of the package but is only in a peripheral region of the package. This embodiment can appropriately be employed in the case where the semiconductor chip that is to be mounted on a semiconductor package has electrodes only in the peripheral region.

In the present embodiment as well, by setting the size L2 of opening 21 of elastmer 2 to be $$L2 \geq L1 + 3h$$

for the size L1 of opening 22 of tape 4 and the thickness h of the elastmer, it becomes feasible to improve the lifetime of the lead wire. The same applies to the present embodiment in that the lifetime of the portion that is joined between the semiconductor chip and mounting board can be improved with the aid of elastmer 2. The present invention enables providing a semiconductor package of high reliability just like the first embodiment.

Fourth Embodiment

Figure 7:
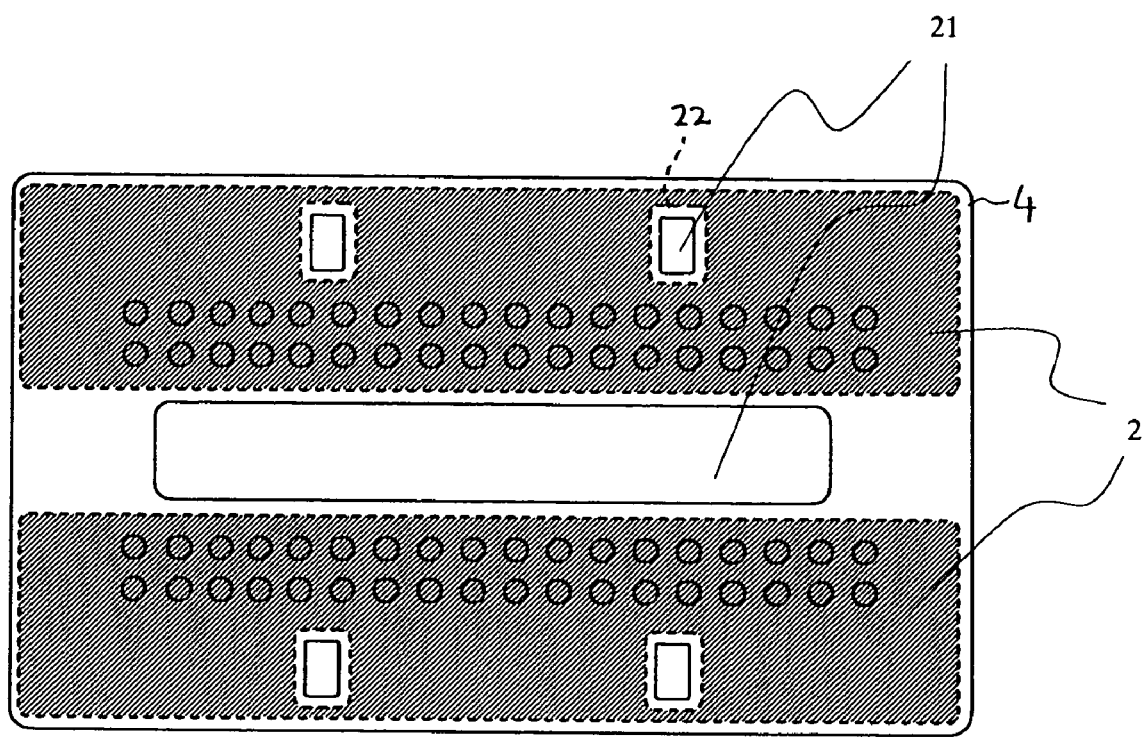
FIG. 7 is a bottom view of the semiconductor package of the fourth embodiment according to the present invention as viewed through the elastmer.

FIG. 7 is a bottom view of a semiconductor package of a fourth embodiment according the present invention. In the figure, planar shapes of elastmers 2 inside the package are represented as being visible.

Two elastmers 2 are employed in the present embodiment as opposed to a single elastmer 2 being employed in the first embodiment. The two elastmers 2 are arranged on both sides of opening 21 in the central region of tape 4, respectively.

In the present embodiment as well, by setting, in any of five openings 21 of tape 4, the distance L between the edges of openings 21 of tape 4 and elastmer 2 to be $$L \geq h + e$$

for the thickness h of elastmer 2 and production fluctuation e, it becomes feasible to improve the lifetime of the lead wire within the semiconductor package.

For this end, with regard to each elastmer 2, openings 22 that correspond respectively to openings 21 located in the peripheral region of tape 4 are set to be a prescribed magnitude larger than respective corresponding openings 21 of tape 4, just like the first embodiment.

On the other hand, elastmer 2 is arranged such that, regarding opening 21 formed in the central region of tape 4, the space between the edge of each elastmer 21 and the edge of this opening 21 is no smaller than h+e. In ordinary cases, the fluctuations e due to size errors and/or assembling errors are smaller than thickness h of elastmer 2. For this reason, by setting the distance L between the edges of elastmer 2 and opening 21 to be $$L \geq 2h,$$

it is ensured that the protrusion length of the edge of tape 4, beyond which wiring lead 5 is projected, is set to the value no smaller than h while allowing room for e.

Thus, the present embodiment as well can provide a semiconductor package of high reliability.

Fifth Embodiment

Figure 8:
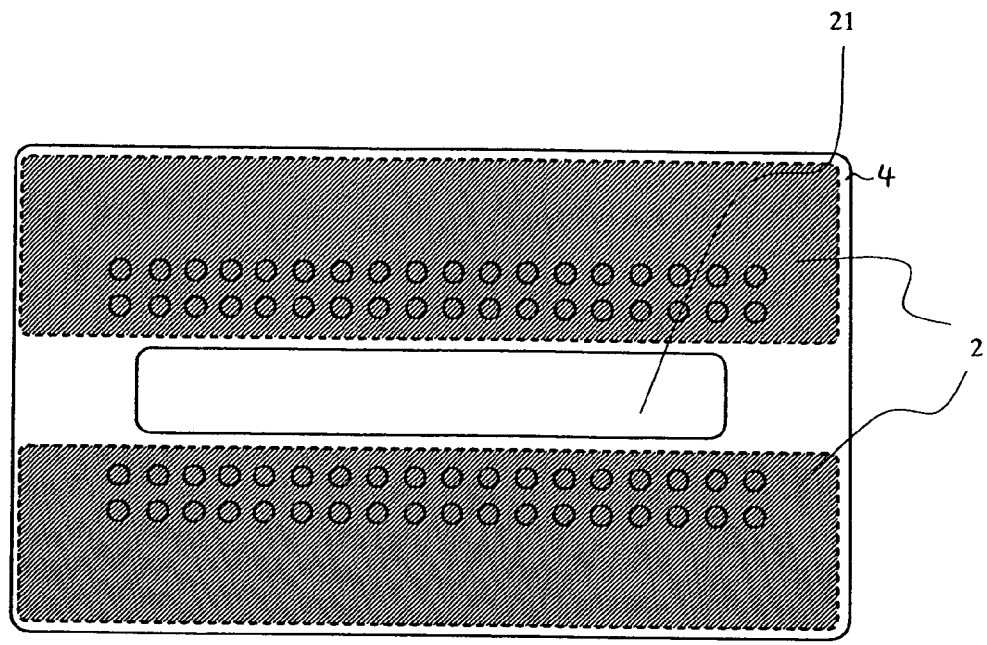
FIG. 8 is a bottom view of the semiconductor package of the fifth embodiment according to the present invention as viewed through the elastmer.

FIG. 8 is a bottom view of a semiconductor package of a fifth embodiment of the present invention. The figure represents a planar shape of elastmer 2 within the package as being visible.

In the present embodiment, tape 4 has opening 21 only in the central region of the semiconductor package but no opening in the peripheral region thereof, just like the second embodiment. Two elastmers 2 are arranged on both sides of opening 21. By setting the position of each elastmer 2 appropriately as in the fourth embodiment, the edge of opening 21 of tape 4, beyond which wiring lead 5 is projected, will protrude from the edge of elastmer 2 by a prescribed length, thereby improving the lifetime of the lead wire.

The present embodiment makes it unnecessary to perform a boring process of elastmer 2, thereby simplifying production.

Sixth Embodiment

Figure 9:
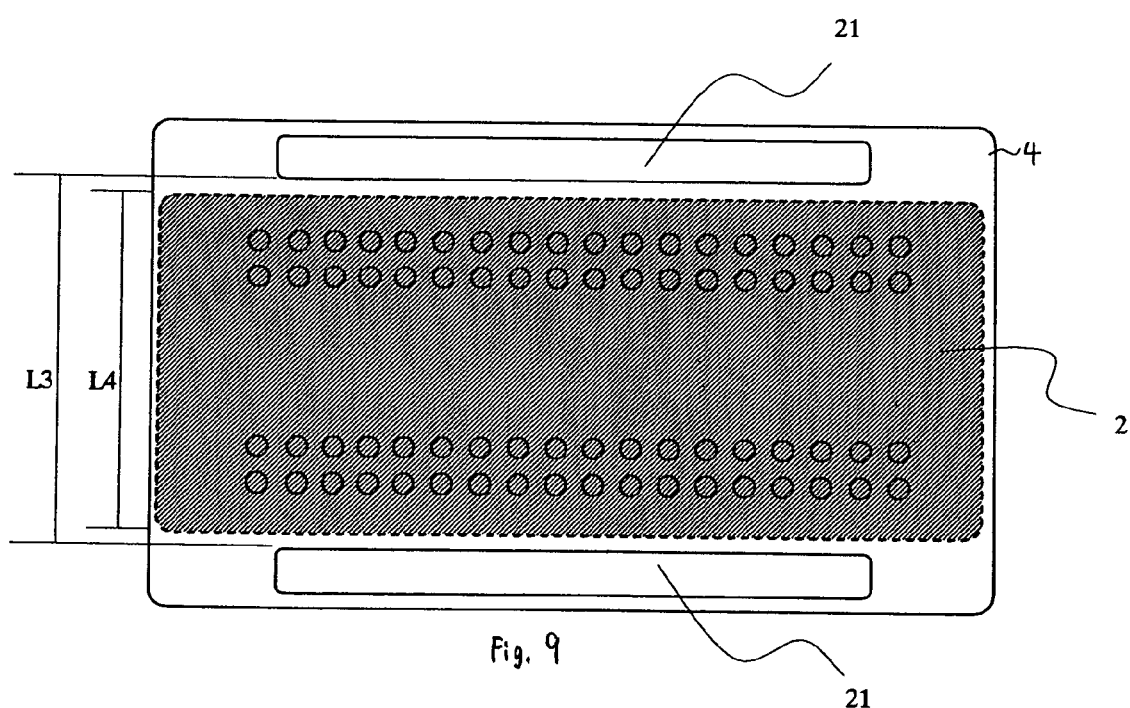
FIG. 9 is a bottom view of the semiconductor package of the sixth embodiment according to the present invention as viewed through the elastmer.

FIG. 9 is a bottom view of a semiconductor package of a sixth embodiment according to the present invention. In the figure, a planar shape of elastmer 2 inside the package is represented as being visible.

In the present embodiment, tape 4 has openings 21 in only the peripheral region of the semiconductor package. Elastmer 2 is arranged between openings 21 on both sides of tape 4.

In this case, by setting the width L4 of elastmer 2 to be $L4 \leq L3-2h-e$ for distance L3 between the two openings 21 of tape 4, wherein h denotes the width of elastmer 2 and e denotes the fluctuations due to size errors and/or assembling errors, concerning both openings of tape 4, the distance L of the edge, beyond which wiring lead is projected, from the edge of the end region of elastmer 2 can be determined to be no smaller than the thickness h of elastmer 2. Because e is smaller than h, the amount of protrusion of tape 4 can be determined to have the value no smaller than h while allowing room for e by setting $L4 \leq L3-3h$, whereby it is feasible to provide a semiconductor package of high reliability.

Seventh Embodiment

Figure 10:
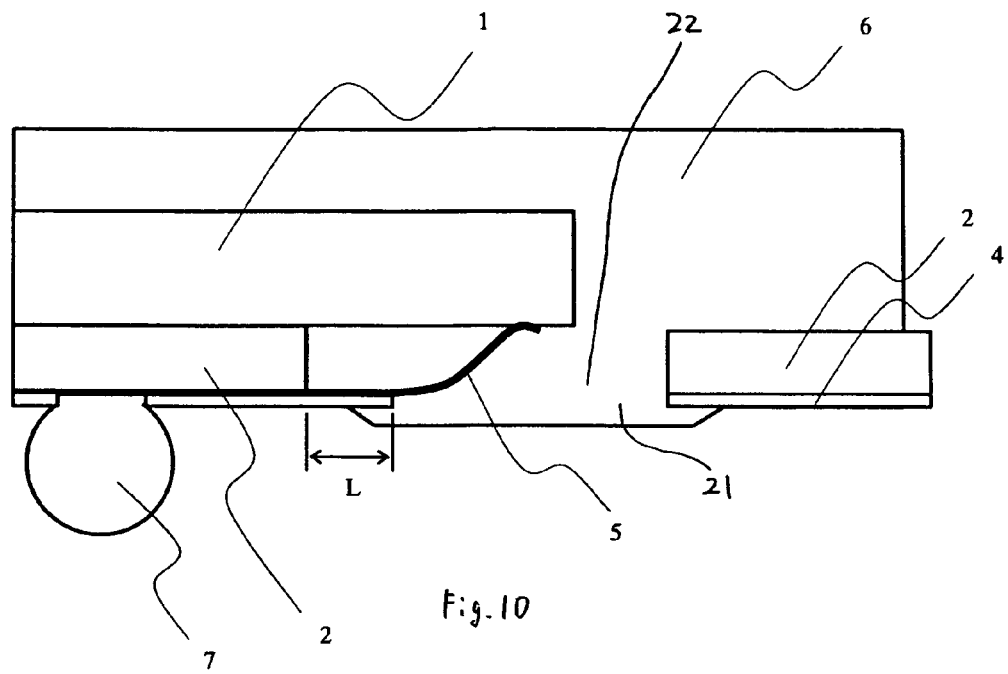
FIG. 10 is an enlarged cross-sectional view of the peripheral region of the opening of the tape in the semiconductor package of the seventh embodiment according to the present invention.

FIG. 10 is an enlarged cross-sectional view of the periphery of opening 21 of tape 4 in the semiconductor package of a seventh embodiment according to the present invention.

In the present embodiment, sealing resin 6 slightly escapes from opening 21 of tape 4 and covers a part of the edge of opening 21 on the surface on the opposite side to the side on which wiring lead 5 is arranged. This structure enlarges the junction area between tape 4 and sealing resin 6, thereby enhancing the junction strength between tape 4 and sealing resin 6 and suppressing exfoliation between tape 4 and sealing resin 6, and also even in cases where exfoliation occurs, arresting arrival of the exfoliation at the portion where wiring lead 5 alone extends, whereby the improvement in the lifetime of the wiring lead can be achieved.

The present embodiment is also configured just like each of the above embodiments in that the distance L between the edges of tape 4 and elastmer 2 is set to a value no smaller than the thickness h of elastmer 2. The present invention allows further improvement in the lead wire lifetime in addition to the improvement of the lead wire lifetime according to the foregoing embodiment, because an improvement of the lead wire lifetime can be obtained from the improvement of the junction strength between tape 4 and sealing resin 6 as described above.

Eighth Embodiment

Figure 11:
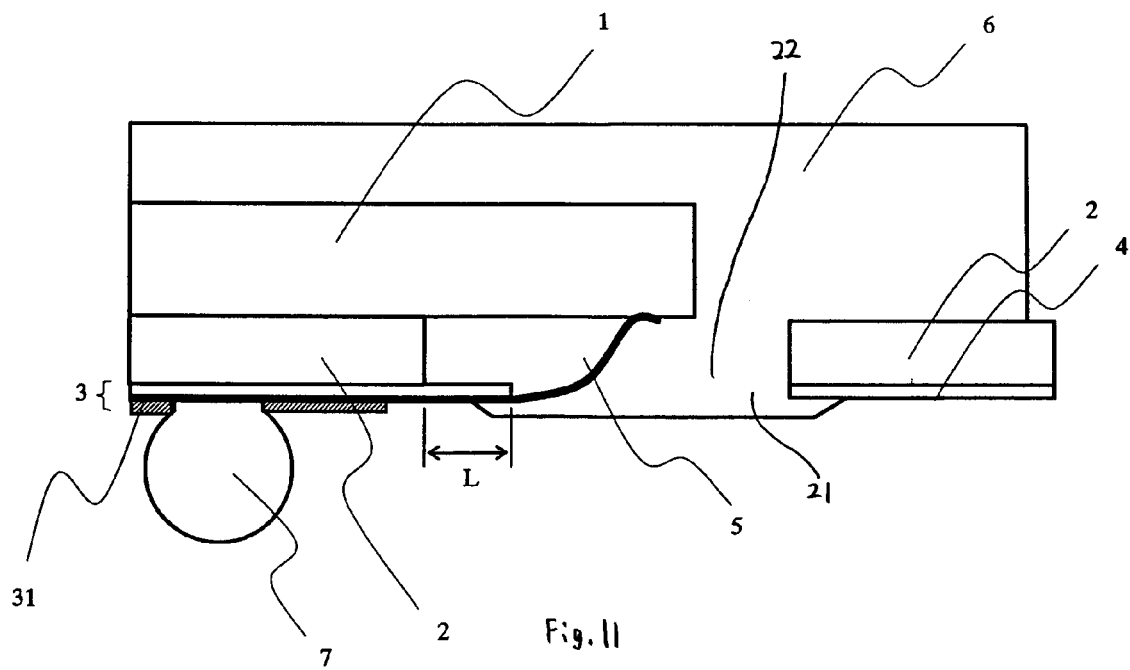
FIG. 11 is an enlarged cross-sectional view of the peripheral region of the opening of the tape in the semiconductor package of the eighth embodiment according to the present invention.

FIG. 11 is an enlarged cross-sectional view of the peripheral region of opening 21 of tape 4 in the semiconductor package of an eighth embodiment according to the present invention.

The present embodiment differs from the first to seventh embodiment in that the structure of flexible wiring board 3 is different. Specifically, wiring lead 5 is laid out on the surface on the side opposite to the elastmer 2 side of tape 4. This structure does not necessitate any opening of tape 4 to connect wiring lead 5 to solder ball 7. In this embodiment, however, a layer of solder resister 31 is formed around the portion to which solder ball 7 is joined, to prevent fused solder from flowing along the surface of wiring lead 5 when solder ball 7 is joined to the mounting board. As a result, a portion of wiring lead 5 serves as a land which is surrounded by the layer of solder resister 31.

Solder resister 31 and wiring lead 5 have small rigidity and hence have little effect on the stress that acts on the interface between tape 4 and sealing resin 6. Thus, in the present embodiment as well, improvement can be achieved in the lead wire lifetime just like in the above embodiments by making sure that at least the edge of each opening of tape 4, beyond which wiring lead 5 is projected, is set to protrude beyond the edge of elastmer 2 with the amount of protrusion to be no smaller than the thickness h of elastmer 2.

Ninth Embodiment

Figure 12:
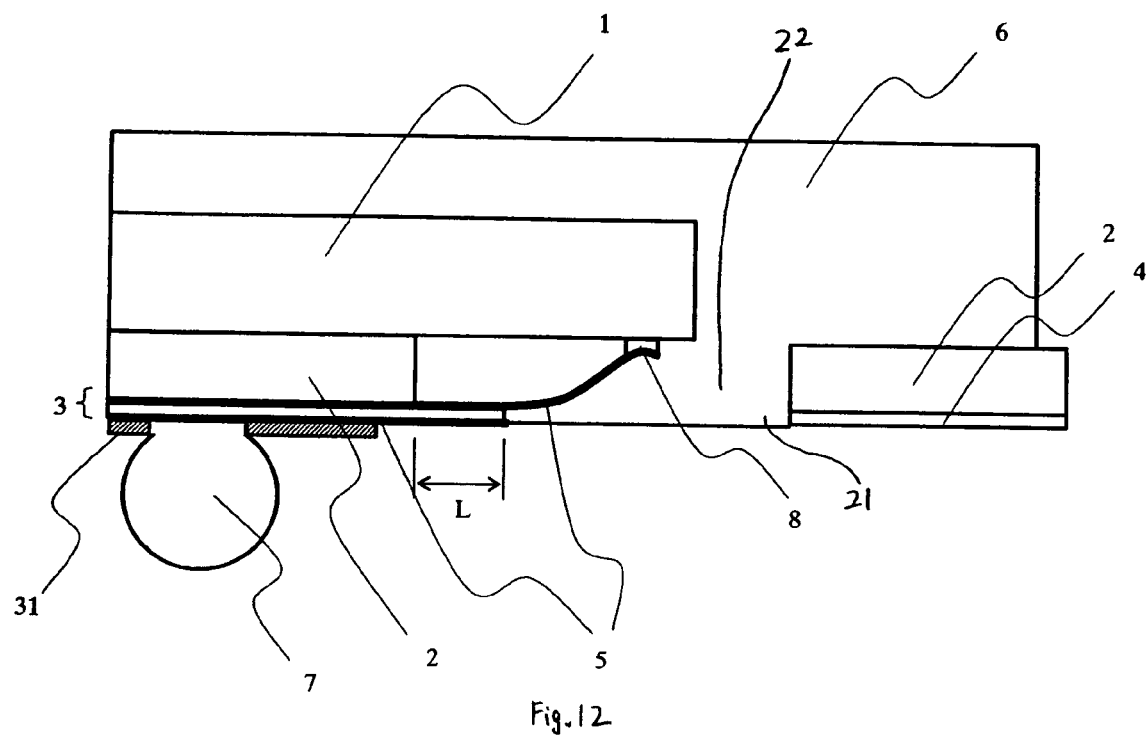
FIG. 12 is an enlarged cross-sectional view of the peripheral region of the opening of the tape in the semiconductor package of the nineth embodiment according to the present invention.

FIG. 12 is an enlarged cross-sectional view illustrating the peripheral region of opening 21 of tape 4 in the semiconductor package of a ninth embodiment according to the present invention.

The present embodiment differs from the first to the eighth embodiments in the structure of flexible wiring board 3. Specifically, wiring leads 5 are laid out on both sides of tape 4. Arranging wiring leads 5 in two layers offers advantages of enabling the characteristic impedances of the circuits made up of wiring leads 5 to be matched to cause reduction of electrical noises, enabling signal transmission at a higher rate, and so on.

While the present embodiment necessitates no opening for connecting wiring lead 5 and solder ball 7 to tape 4, it is necessary to form a layer of solder resister 31 as with the eighth embodiment. Solder resister 31 and wiring lead 5 have small rigidity and hence have little effect on the stress that acts on the interface between tape 4 and sealing resin 6 even in the case of providing two wiring layers. Thus, in the present embodiment as well, the improvement can be achieved in the lead wire lifetime just as in the above embodiments by making sure that at least the edge of each opening of tape 4, beyond which wiring lead 5 is projected, is set to protrude beyond the edge of elastmer 2 with the amount of protrusion to be no smaller than the thickness h of elastmer 2.

Tenth Embodiment

Figure 13:
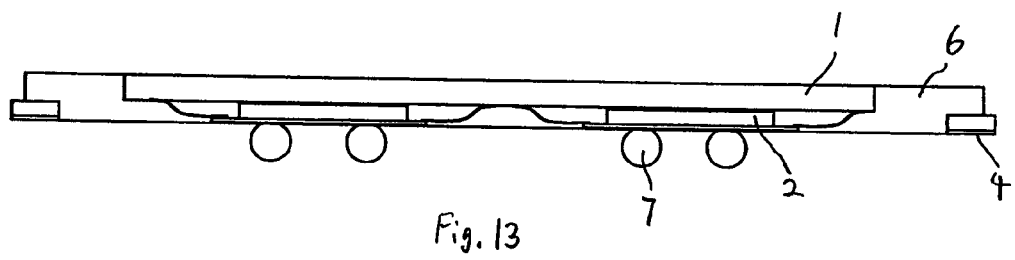
FIG. 13 is a cross-sectional view of the semiconductor package of the tenth embodiment according to the present invention.

FIG. 13 is a cross-sectional view of a semiconductor package of a tenth embodiment according to the present invention. Difference from the first embodiment is that sealing resin 6 is filled up to a level at which sealing resin 6 surrounds the entire side surface of semiconductor chip 1, and semiconductor chip 1 is exposed to the ambience in the back surface opposite to the surface of semiconductor chip 1 joined with elastmer 2. This structure enables lowering the height of the semiconductor package lower than that of the first embodiment, thereby achieving compactification of the semiconductor package.

In the present embodiment, sealing resin 6 is not applied to the back surface side of semiconductor chip 1. Therefore, the difference in a linear thermal expansion coefficient of semiconductor chip 1 from elastmer 2 etc. causes an increased warp deformation of the semiconductor package. Although the magnitude of the warp deformation in the overall semiconductor package influences stress on the interface between tape 4 and sealing resin 6, the level of influence is small as compared to the influence of the protrusion amount L of the edge of tape 4 that protrudes from the edge of elastmer 2. Thus, in the present embodiment as well, improvement in the lead wire lifetime can be achieved just like in the above embodiments by making sure that at least the edge of each opening of tape 4, beyond which wiring lead 5 is projected, is set to protrude beyond the edge of elastmer 2 with the amount of protrusion to be no smaller than the thickness h of elastmer 2.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
   a semiconductor chip having an electrode formed on a major surface thereof,
   an elastic structural member having first and second surfaces positioned on opposite sides to each other with said first surface fixed to said major surface of said semiconductor chip so as to expose said electrode,
   a base member fixed to said second surface of said elastic structural member, and
   a wiring fixed to said base member and projected beyond an edge of said base member, extended in a direction of a thickness of and across said elastic structural member and connected to said electrode of said semiconductor chip, wherein
   the edge of said base member, beyond which said wiring is projected, protrudes beyond an edge of said elastic structural member by a length no smaller than a thickness of said elastic structural member.

2. A semiconductor device according to claim 1, wherein said elastic structural member and base member have openings, respectively, in positions corresponding to said electrode of said semiconductor chip, and
   said wiring is projected through said opening of said base member, extended through said opening of said elastic structural member and connected to the electrode of said semiconductor chip.

3. A semiconductor device according to claim 1, wherein said wiring is fixed to a surface of said base member fixed to said second surface of said elastic structural member.

4. A semiconductor device according to claim 1, wherein said wiring is fixed to a surface of said base member opposite to a surface of said base member fixed to said second surface of said elastic structural member.

5. A semiconductor device according to claim 1, wherein a land region is provided in said wiring.

6. A semiconductor device according to claim 1, wherein at least a gap formed between said semiconductor chip and said base member surrounding a portion of said semiconductor chip where said electrode is formed, is sealed with resin.

* * * * *